United States Patent
Murai et al.

(10) Patent No.: US 10,285,317 B2
(45) Date of Patent: May 7, 2019

(54) COMPONENT MOUNTER

(71) Applicant: FUJI CORPORATION, Chiryu-shi (JP)

(72) Inventors: Masaki Murai, Nishio (JP); Toshihiko Yamasaki, Nisshin (JP); Toshinori Shimizu, Kariya (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/736,622

(22) PCT Filed: Jun. 15, 2015

(86) PCT No.: PCT/JP2015/067211
§ 371 (c)(1),
(2) Date: Dec. 14, 2017

(87) PCT Pub. No.: WO2016/203532
PCT Pub. Date: Dec. 22, 2016

(65) Prior Publication Data
US 2018/0192554 A1 Jul. 5, 2018

(51) Int. Cl.
*H05K 13/04* (2006.01)
*H05K 13/02* (2006.01)

(52) U.S. Cl.
CPC ........... *H05K 13/046* (2013.01); *H05K 13/02* (2013.01); *H05K 13/04* (2013.01)

(58) Field of Classification Search
CPC ...... H05K 13/02; H05K 13/04; H05K 13/041; H05K 13/046; H05K 13/08; H05K 13/081; H05K 13/085; H05K 13/086; H05K 13/0882; H05K 13/0038
See application file for complete search history.

(56) References Cited

U.S. PATENT DOCUMENTS

2011/0289772 A1* 12/2011 Kosaka .............. H05K 13/0452
29/832

FOREIGN PATENT DOCUMENTS

| JP | 6-29349 A | 2/1994 |
| JP | 11-67839 A | 3/1999 |
| JP | 2001-118149 A | 4/2001 |
| JP | 2011-199184 A | 10/2011 |

(Continued)

OTHER PUBLICATIONS

Translation of WO-2016031806-A1, Mar. 2016, Nimura Masatsugu (Year: 2016).*

(Continued)

*Primary Examiner* — George R Koch
(74) *Attorney, Agent, or Firm* — Oblon, McClelland, Maier & Neustadt, L.L.P.

(57) ABSTRACT

A board held by a board holding plate is heated by a heater, and after performing mounting processing of components in a region of the mounting regions of the board, a pressing process of using a pressing head to apply pressure to all the components mounted in the region at once while heating the board is performed, and a next mounting process of mounting components in a next region is performed while performing the pressing process. By performing the pressing process and the mounting process in parallel, waiting time for each process in the cycle of the mounting process and the pressing process is reduced, such that overall work time is reduced.

4 Claims, 10 Drawing Sheets

(56) References Cited

FOREIGN PATENT DOCUMENTS

WO  WO 2014/157134 A1   10/2014
WO  WO-2016031806 A1 *  3/2016  ............... H05K 3/34

OTHER PUBLICATIONS

Extended European Search Report dated Apr. 19, 2018 in corresponding European Patent Application No. 15895553.4, 6 pages.
International Search Report dated Aug. 25, 2015 in PCT/JP2015/067211 filed Jun. 15, 2015.

* cited by examiner (a)

(b)

(a)

(b)

(c)

(d)

(e)

(f)

COMPONENT MOUNTER

REFERENCE TO RELATED APPLICATIONS

This application is a 371 of PCT/JP2015/067211, filed on Jun. 15, 2015.

TECHNICAL FIELD

The present disclosure relates to a component mounter.

BACKGROUND ART

Conventionally, it is known, after mounting a component on a board, to secure the component to the board by applying pressure to the mounted component while heating the board or the component. For example, disclosed in patent literature 1 is an electronic component manufacturing device provided with a bonding head that has a heater built into a pressing section, and a receiving stand; with the device, an external electrode section of a liquid crystal display body held on a holding table and a driver IC chip arranged on the external electrode section are sandwiched by the bonding head and the receiving table, and an input electrode of the external electrode section and an output electrode of the driver IC chip are bonded by pressure being applied while the driver IC chip is heated by the heater.

Patent literature 1: JP-A-H11-67839

SUMMARY

However, with the above device, mounting of the component on the board and securing of the component are performed in different devices, so production efficiency is low. Also, if a temperature difference arises across the entire board when the board is heated, the board may warp easily, which may worsen board production yields.

An object of the present disclosure is to improve production efficiency while curtailing occurrences of defect boards.

The present disclosure uses the following means to achieve the above object.

A component mounter of the present disclosure is a component mounter for mounting components on a board, the component mounter including:

a holding member configured to hold the board at a holding surface;

a heater configured to heat an entire surface of the board;

a mounting head configured to mount the components on the board held by the holding member;

a pressing head configured to apply pressure to the component mounted on the board at a specified region that is narrower than a mounting region of the board; and a control means configured to, after using the mounting head to perform a mounting process of mounting a component in the specified region within the mounting region of the board held by the holding member, use the pressing head to perform a pressing process of applying pressure to the component in the specified region mounted on the board while the heater heats the entire surface of the board, and use the mounting head to perform a next mounting process of mounting a component in the next specified region of the board while the pressing process is being performed.

With a component mounter of the present disclosure, after using a mounting head to perform a mounting process of mounting a component in a specified region within a mounting region of a board, a pressing head is used to perform a pressing process of applying pressure to the component in the specified region mounted on the board while heating the entire surface of the board with a heater, and then the mounting head is used to perform a next mounting process of mounting a component in a next specified region of the board while the pressing process is being performed. In this manner, by performing the mounting process and the pressing process in parallel, it is possible to shorten the overall work time while maintaining sufficient time for the pressing process. Also, because the heater heats the entire surface of the board, bending and warping of the board is curtailed. As a result, it is possible to improve production efficiency while curtailing production of defective boards.

In such a component mounter of the present disclosure, the heater may be provided on the holding member so as to be capable of heating the entire surface of the board via the holding surface. Thus, it is possible to effectively curtail the occurrence of bending or warping of the board while the board is being heated.

Such a component mounter of the present disclosure may further include a feeding mechanism configured to feed the holding member in a specified direction, wherein the control means is configured to, after performing the mounting process, perform the pressing process after heating the board with the heater and feeding the holding member a specified amount using the feeding mechanism in a state with the holding member holding the board, and perform the next mounting process while performing the pressing process, such that the pressing process and the mounting process are performed repeatedly while shifting the specified region by the specified amount each time. Accordingly, it is possible to perform the mounting process and pressing process more efficiently.

With such a component mounter of the present disclosure, the pressing head may be configured to apply pressure to the component at, as the specified region, a perpendicular region that is along a perpendicular direction that is perpendicular with respect to the feeding direction of the board, and the control means may be configured to, after performing the mounting process of mounting the component in the perpendicular region of the board using the mounting head, perform the pressing process after feeding the holding member the specified amount using the feeding mechanism, and use the mounting head to perform the next mounting process of mounting a component in the next perpendicular region while performing the pressing process.

DESCRIPTION OF EMBODIMENTS

An embodiment of the present disclosure is described below.

Figure 1:
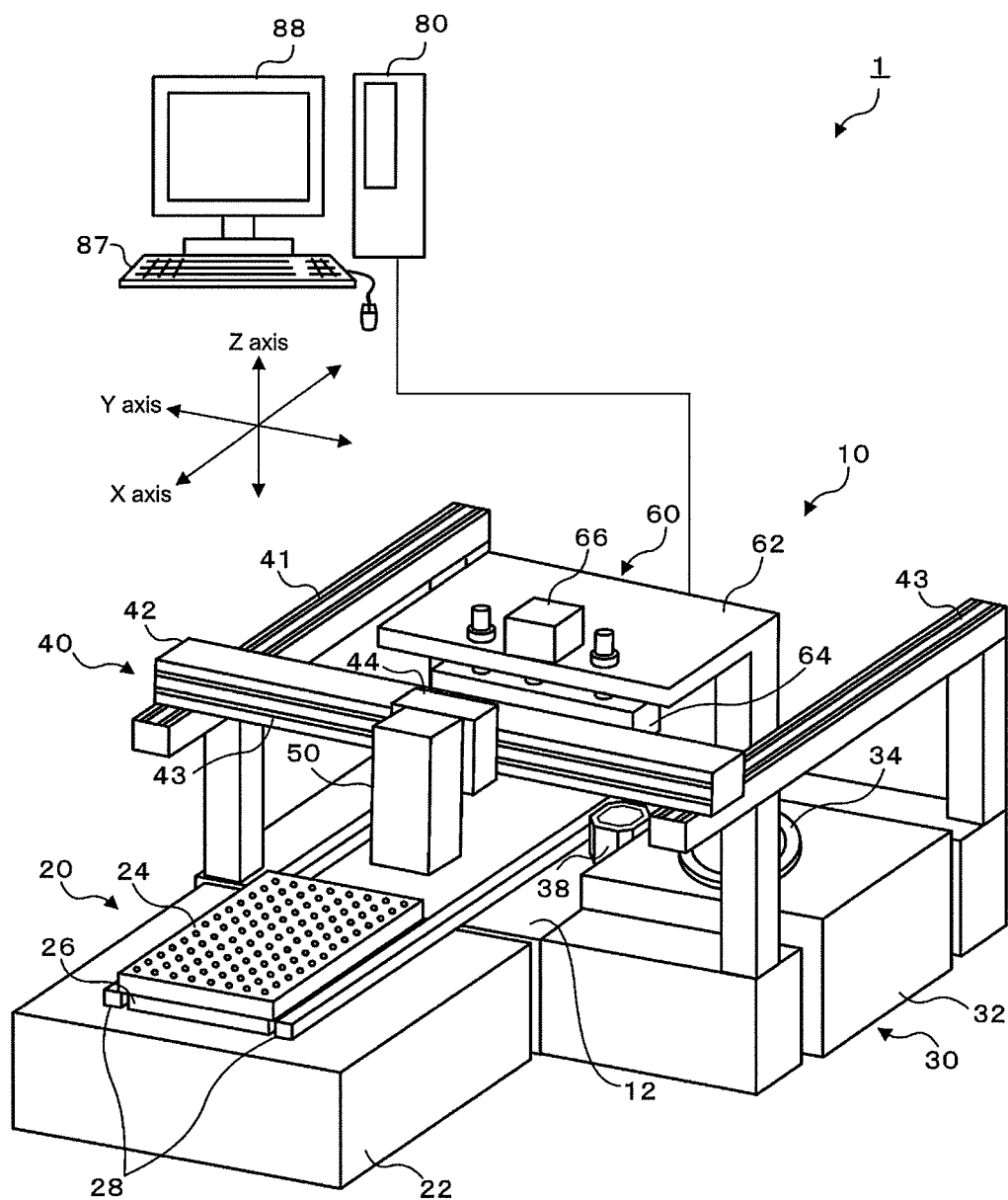
FIG. 1 shows an outline of the configuration of an embodiment, component mounting system 1.
Figure 2:
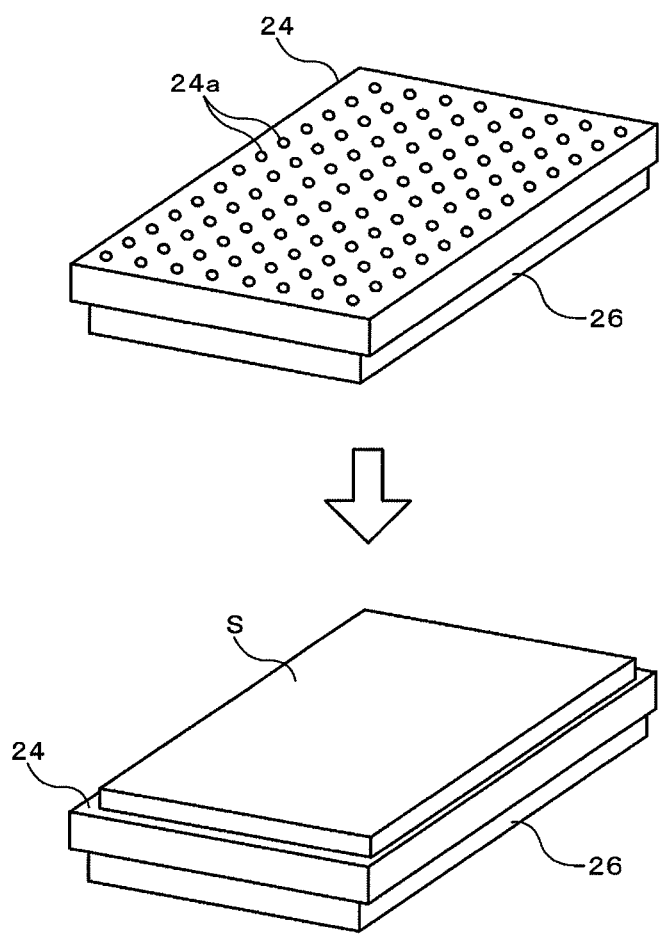
FIG. 2 shows board holding plate 24 holding board S.
Figure 3:
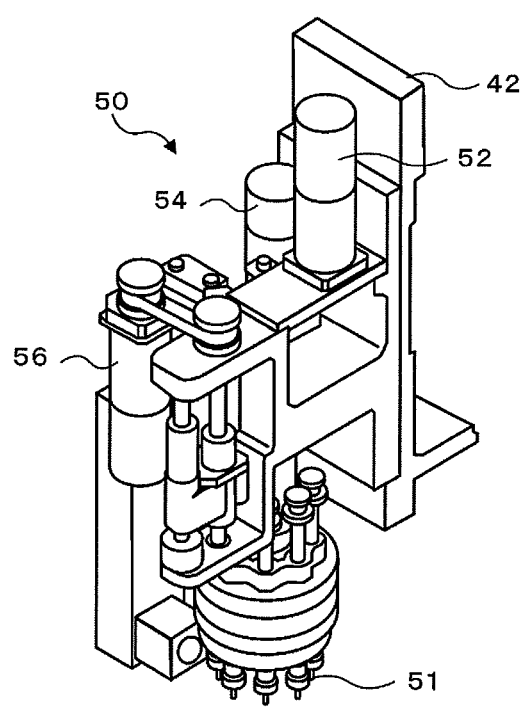
FIG. 3 shows an outline of the configuration of mounting head 50.
Figure 4:
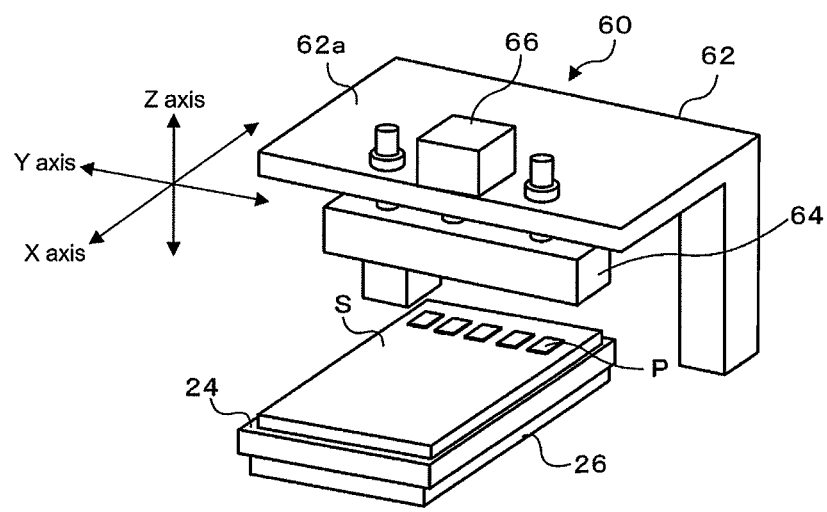
FIG. 4 shows pressing device 60 applying pressure to component P mounted on board S.
Figure 4:
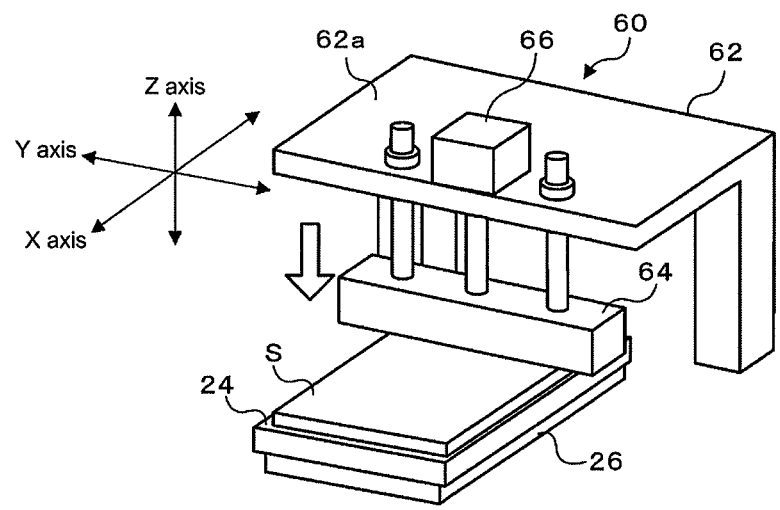
Figure 5:
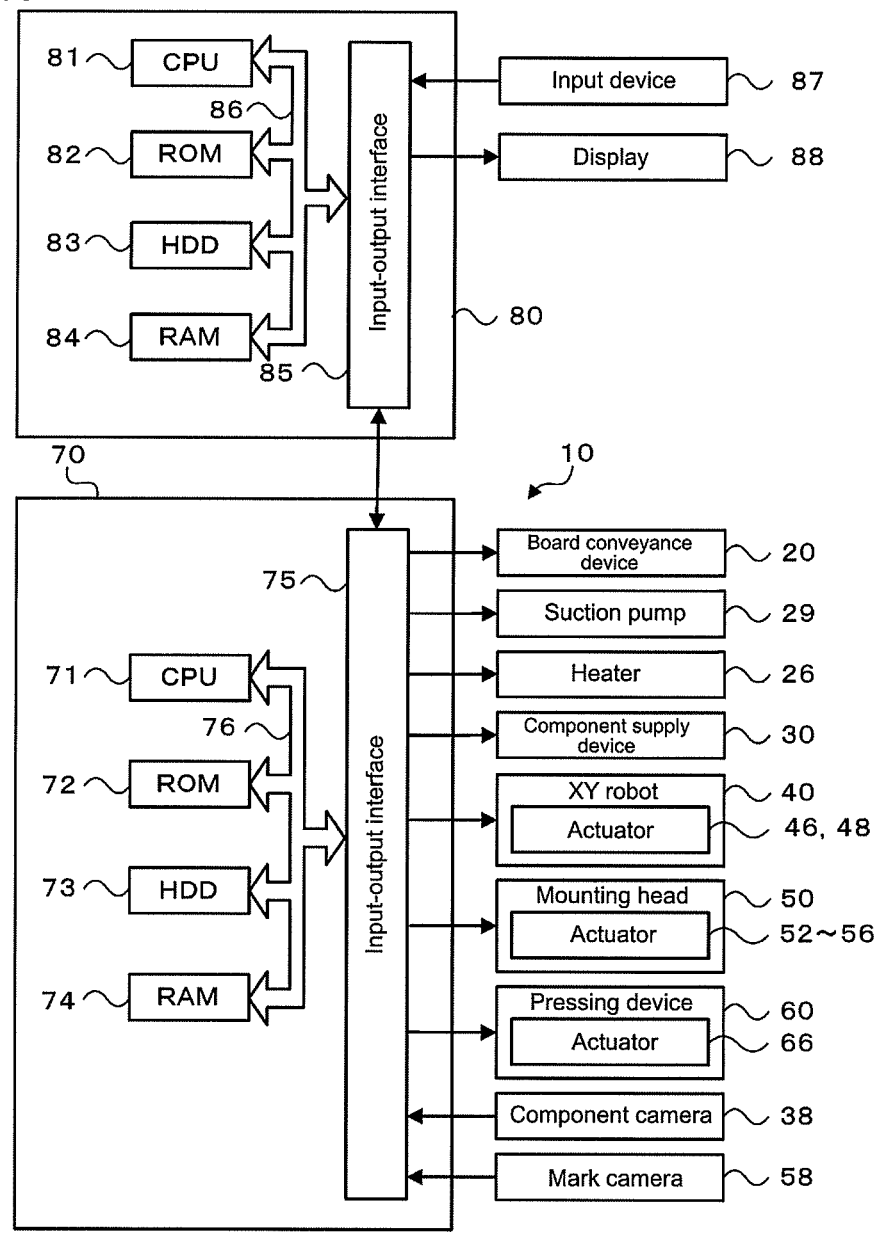
FIG. 5 is a block diagram showing electrical connections of management device 80 and control device 70 of component mounter 10.

FIG. 1 shows an outline of the configuration of an embodiment, component mounting system 1; FIG. 2 shows board holding plate 24 holding board S; FIG. 3 shows an outline of the configuration of mounting head 50; FIG. 4 shows pressing device 60 applying pressure to component P mounted on board S; and FIG. 5 is a block diagram showing electrical connections of management device 80 and control device 70 of component mounter 10. Note that, a front-rear (near side-far side) direction in FIG. 1 is an X-axis direction, a left-right direction is a Y-axis direction, and an up-down direction is a Z-axis direction.

As shown in FIG. 1, an embodiment, component mounting 1, is provided with: component mounter 10 capable of performing a mounting process of mounting component P on board S via a thermosetting adhesive, and a pressing process of bonding the mounted component P to board S by applying pressure while heating board S; and management device 80 that manages the overall system.

As shown in FIG. 1, component mounter 10 is provided with base 12, board conveyance device 20 that conveys board S, component supply device 30 that supplies component P, mounting head 50 for performing a mounting process, XY robot 40 for moving mounting head 50 in XY directions, pressing device 60 for performing a pressing process, and control device 70 for performing control of devices overall. Note that, component mounter 10 is also provided with items such as component camera 38 arranged on base 12 for capturing an image of component P picked up (by suction) by mounting head 50 (suction nozzle 51), and mark camera 58 arranged on mounting head 50 that is capable of imaging reference marks used for positioning provided on board S (refer to FIG. 5).

As shown in FIG. 1, board conveyance device 20 is provided with: stand 22 including an upper surface roughly the same height as an upper surface of base 12; board holding plate 24 that holds the entire underside surface of board S on a top surface (holding surface); heater 26 arranged under board holding plate 24 that heats the entire surface of board S held by board holding plate 24 via board holding plate 24; and moving mechanism 28 that moves board holding plate 24 back and forth in the X-axis direction between stand 22 and base 12. As shown in FIG. 2, board holding plate 24 has multiple suction holes 24a formed in the top surface thereof and suction-holds board S set on the top surface by using negative pressure supplied through suction holes 24a that is achieved by suction force from suction pump 29 (refer to FIG. 5). Moving mechanism 28, in this embodiment, although not shown in detail, is configured as a shuttle mechanism that shuttles board holding plate 24 by driving a timing belt attached to board holding plate 24 using a motor.

Component supply device 30, in this embodiment, is configured as a wafer supply device that supplies a round wafer 34 that has been diced into a matrix of multiple chips (components P). Note that, component supply device 30 is not limited to an item that supplies wafers 34, it may be an item that supplies tape in which components are stored at a specified interval, or an item that supplies trays in which components are arranged.

As shown in FIG. 3, mounting head 50 is configured as a multiple nozzle head on which multiple suction nozzles 51 are arranged in a circumferential direction. Mounting head 50 is provided with R-axis actuator 52 for revolving the head, θ-axis actuator 54 for rotating each suction nozzle 51, and Z-axis actuator that moves suction nozzle 51 in the Z-axis (up-down) direction. A suction opening of suction nozzle 51 is connected to a suction pump, which is not shown. Suction nozzle 51 picks up component P by negative pressure supplied to the suction opening from the suction pump.

As shown in FIG. 1, XY robot 40 is provided with pair of left-right X-axis guide rails 41 provided at an upper level along the front-rear direction (X-axis direction), X-axis slider 42 supported on the pair of left-right X-axis guide rails 41 so as to be movable along X-axis guide rails 41, Y-axis guide rails 43 provided on a side surface of X-axis slider 42 in a left-right direction (Y-axis direction), and Y-axis slider 44 provided to be movable along Y-axis guide rails 43. Note that, X-axis slider 42 is moved by the driving of X-axis actuator 46 (refer to FIG. 5), and Y-axis slider 44 is moved by the driving of Y-axis actuator 48 (refer to FIG. 5). Mounting head 50 is provided on Y-axis slider 44, and control device 70 moves mounting head 50 to any position in an XY plane by performing drive control of XY robot 40 (X-axis actuator 46 and Y-axis actuator 48).

As shown in FIG. 4, pressing device 60 is provided with holding stand 62 formed in approximately an L-shape such that horizontal section 62a at an upper surface is parallel with the XY plane (upper surface of base 12) when viewed from the side, pressing head 64 including a pressing surface (lower surface) for applying pressure to component P mounted on board S, and Z-axis actuator 66 provided on horizontal section 62a of support stand 62 that moves pressing head 64 in the Z-axis (vertical) direction. Pressing head 64 includes a pressing surface with a width that enables multiple components P mounted on board S to be pressed at once. In this embodiment, pressing head 64 includes a rectangular pressing surface that covers the entire width in the Y-axis direction (direction perpendicular to board conveyance direction) of the mounting region of board S, and that is narrower in the X-axis direction.

As shown in FIG. 5, control device 70 is configured from CPU 71 that is based around a microprocessor, and is also provided with ROM 72, HDD 73, RAM 74, and input-output interface 75. These items are electrically connected by bus 76. Image signals from component camera 38, image signals from mark camera 58, and so on are inputted into control device 70 via input-output interface 75. On the other hand, outputted from control device 70 via an output board are control signals to board conveyance 20, control signals to component supply device 30, drive signals to XY robot 40 (X-axis actuator 46 and Y-axis actuator 48), drive signals to mounting head 50 (R-axis actuator 52, θ-axis actuator 54, and Z-axis actuator 56), drive signals to pressing device 60 (Z-axis actuator 66), drive signals to heater 26, and drive signals to suction pump 29. Also, control device 70 is connected to management device 80 such that two-way communication is possible, and they perform communication of data and control signals with each other.

Management device 80, for example, is a general purpose computer provided with items such as CPU 81, ROM 82, HDD 83, RAM 84, and input-output interface 85. These items are electrically connected by bus 86. Management device 80 receives input signals from input device 87 such as a mouse or a keyboard via input-output interface 85, and image signals are output from management device 80 to display 88 via input-output interface 85. HDD 93 memorizes a production plan of board S. Here, the board production plan is a plan that defines which components should be mounted on the board and in what order by component mounter 10, along with how many boards S mounted with components P in this manner are to be manufactured, and so on. Management device 80 creates a production plan based on data (type of mounting head to be used, type and size of components P to be mounted, mounting positions of each component P, and so on) entered by an operator via input device 87, and sends the created production plan to component mounter 10.

Figure 6:
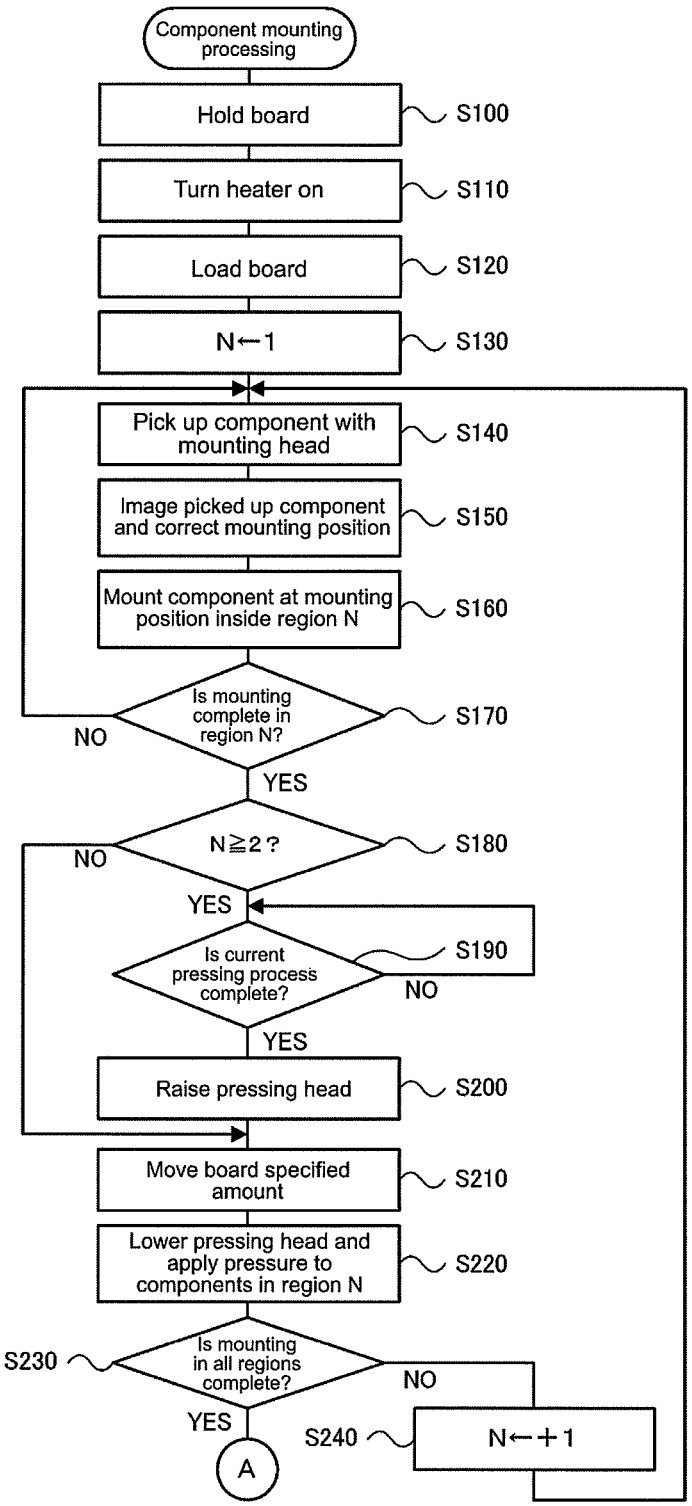
FIG. 6 is a flowchart showing an example (a first half) of component mounting processing performed by CPU 71 of control device 70.
Figure 7:
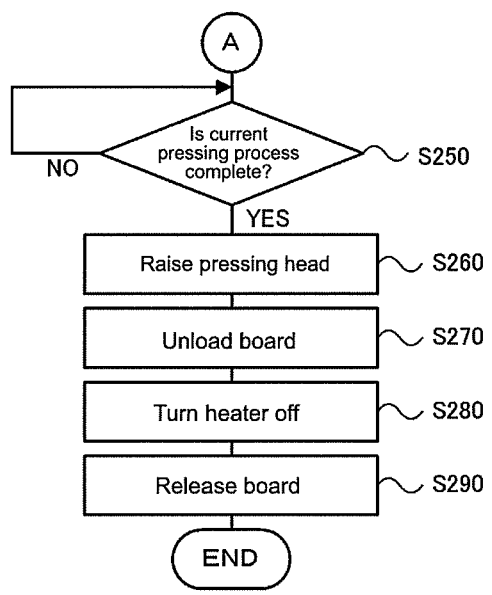
FIG. 7 is a flowchart showing an example (a second half) of component mounting processing performed by CPU 71 of control device 70.
Figure 8:
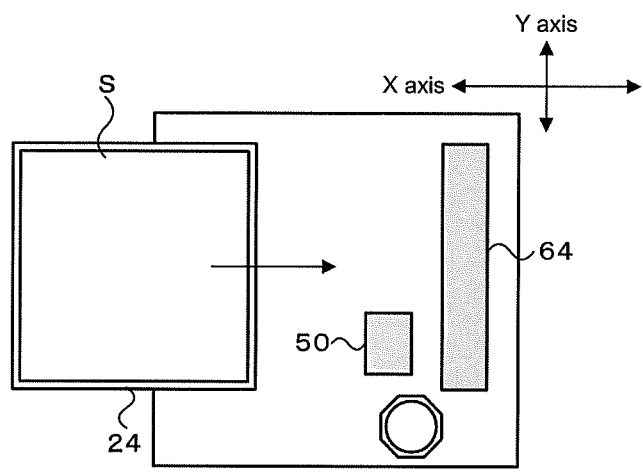
FIG. 8 shows a mounting process and a pressing process being performed.
Figure 8:
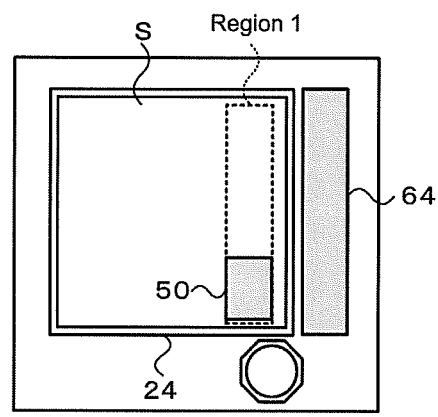
Figure 8:
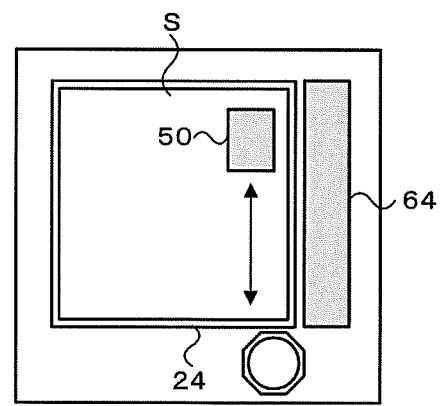
Figure 9:
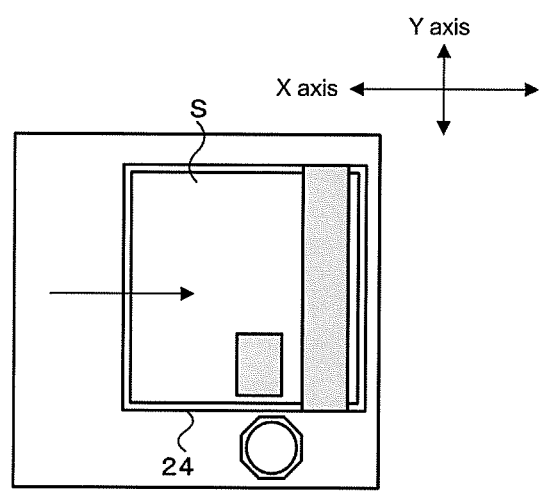
FIG. 9 shows a mounting process and a pressing process being performed.
Figure 9:
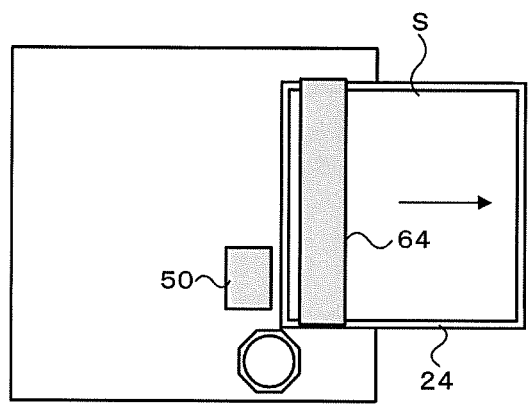
Figure 9:
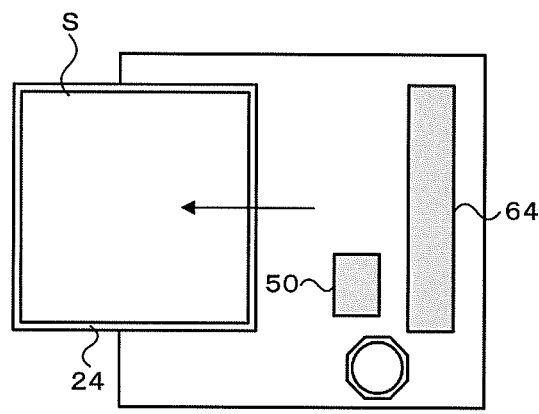

Next, operation of the embodiment of component mounter 10 configured as above is described. FIGS. 6 and 7 are flowcharts showing an example of component mounting processing performed by control device 70. This processing is performed when mounting of component P has been indicated by management device 80 receiving an instruction signal. With regard to component mounting processing, below, descriptions are given with reference to the mounting process and pressing process shown in FIGS. 8 and 9.

When component mounting processing is performed, CPU 71 of control device 70, first, performs drive control of suction pump 29 such that board S set on board holding plate 24 is suction-held (S100), and turns heater 26 on (S110). By this, board S is heated by heater 26 via board holding plate 24 in a state with the entire surface held by board holding plate 24. Therefore, it is possible to prevent temperature differences arising across the entire board, thus curtailing bending and warping of board S caused by temperature differences. Note that, the setting of board S on board holding plate 24 may be performed manually by an operator, or may be performed automatically using a board supply device, which is not shown.

Figure 10:
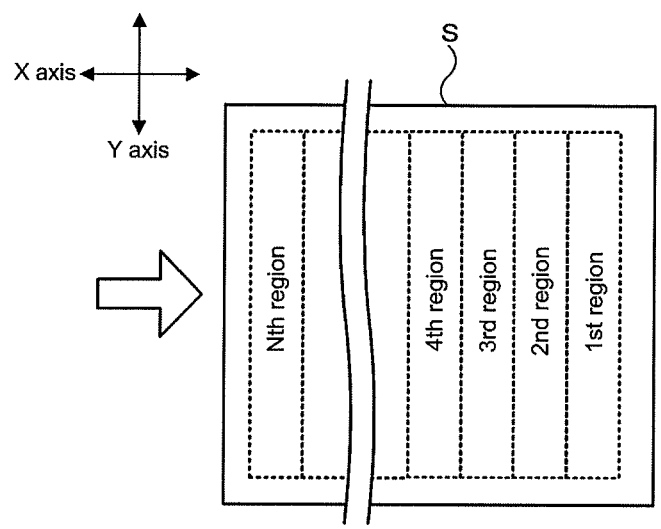
FIG. 10 illustrates mounting regions of board S.

CPU 71, when heater 26 is turned on, performs drive control of moving mechanism 28 such that board S held by board holding plate 24 is conveyed to an initial position inside the machine (S120, refer to FIG. 8[*a*]), and initializes a value of 1 (sets region 1) for region N which is the current target region for mounting from all the mounting regions of board S (S130). Here, in this embodiment, an initial position is where region 1 is positioned in front in the X direction of a position directly above which is pressing head 64 (refer to FIG. 8[*b*]). FIG. 10 illustrates mounting regions of board S. As shown, the mounting regions of board S are divided into first to nth rectangular regions with the short side lined up in the X-axis direction (board conveyance direction), and the mounting process and pressing process is performed in each region. Each region is approximately the same as the region of the pressing surface of pressing head 64, and all the components P mounted inside one region can be pressed by pressing head 64 at once.

Next, CPU 71 performs drive control of XY robot 40 and mounting head 50 to apply negative pressure to suction nozzle 51 so as to pick up component P supplied by component supply device 30 using suction nozzle 51 (S140). Continuing, CPU 71 performs drive control of XY robot 40 to move mounting head 50 above component camera 38, and uses component camera 38 to capture an image of component P (pickup component) held by suction nozzle 51, then processes the image to measure the pickup deviation of the pickup component, and sets a correction amount with respect the mounting position of the pickup component based on the measured pickup deviation amount (S150). Then, CPU 71, based on the set correction amount and the mounting position of the pickup component specified in the production plan, performs drive control of XY robot 40 and mounting head 50 and performs mounting processing (mounting process) of mounting the pickup component at the mounting position inside region N of board S by applying positive pressure to suction nozzle 51 (S160, refer to FIG. 8[*c*]). CPU 71, upon performing mounting processing, determines whether mounting of components P in region N that is the current mounting target is complete (S170). In this embodiment, region N is wide enough for a single row of components P to be mounted in the Y-axis direction (direction perpendicular to the board conveyance direction). Accordingly, processing of S170 determines that mounting is complete when a single row of components P has been mounted in the Y-axis direction. CPU 71, if determining in S170 that mounting of components P in region N is not complete, repeats processing of S140 to S170.

On the other hand, CPU 71, if determining that mounting of components P in region N is complete, determines whether N is a value of 2 or greater (S180). Here, assuming that components P have been mounted in region 1, CPU 71 determines in S180 that N is not 2 or greater, that is, that N is 1, and after performing drive control of moving mechanism 28 to move board S a specified amount such that region N in which components P were mounted is directly below pressing head 64 (S210, refer to FIG. 9[*d*]), performs pressing processing (pressing process) by performing drive control of pressing device 60 such that pressing head 64 is lowered until the upper surfaces of components P mounted inside region N are contacted by the pressing surface of pressing head 64 (S220). By this, pressure is applied to all components P mounted in region N (region 1) at once by pressing head 64.

CPU 71, upon starting the pressing process, determines whether mounting of components P has been completed for all mounting regions of board S (S230). CPU 71, if determining that mounting of all components P is not complete, increments N by 1 (S240), and performs mounting processing (mounting process) of components with respect to the next mounting target region, region (N+1) (S140 to S170). That is, CPU 71 performs mounting processing with respect to the next region (N+1) while performing pressing processing with respect to region N. In this manner, by performing the pressing process and the mounting process in parallel, waiting time for each process is reduced, such that overall work time is reduced.

CPU 71, after incrementing region N by 1 in S240 and performing mounting processing of S140 to S170, determines in S180 that N is 2 or greater, and waits for the pressing process (bonding of component P) being performed to complete (S190). Here, in this embodiment, processing of S190 is performed by determining whether a specified time (for example, 0.5 seconds) has elapsed since starting performing the pressing process in S220. CPU 71, if determining that the pressing process being performed has been completed, performs drive control of pressing device 60 to raise pressing head 64 such that pressing head 64 is separated from components P (S200), and in parallel moves board S a specified amount such that pressing head 64 is directly above the mounting target region (N+1) of the mounting process that was being performed (S210), and then lowers pressing head 64 and starts performing pressing processing with respect to the components P mounted in the region (N+1) (S220). In this manner, by moving board S a specified amount each time, the cycle of mounting processing and pressing processing is performed consecutively while shifting the target mounting region (refer to FIG. 9[*e*]).

CPU 71, if determining in S230 that mounting of components P is complete for all mounting regions of board S, waits for the completion of the pressing process currently being performed (S250), and then performs drive control of pressing device 60 to raise pressing head 64 (S260). Then, CPU 71 performs drive control of moving mechanism 28 to convey board S out of the machine (S270, refer to FIG. 9[f]), turns off heater 26, and performs drive control of suction pump 29 such that holding of board S is released (S290), and ends component mounting processing.

Correspondences between constituent elements of the present embodiment and constituent elements of the disclosure will be clarified here. Board holding plate 24 of this embodiment corresponds to a "holding member" of the present disclosure, heater 26 corresponds to a "heater," mounting head 50 corresponds to a "mounting head," pressing head 64 corresponds to a "pressing head," and CPU 71 of control device 70 that performs component mounting processing of FIGS. 6 and 7 corresponds to a "control means." Also, moving mechanism 28 (shuttle mechanism) corresponds to a "feeding mechanism."

Component mounter 10 of the above-described embodiment is configured such that board S held by board holding plate 24 can be heated by heater 26, and after performing mounting processing of components P in region N of the mounting regions of board S, performs a pressing process of using pressing head 64 to apply pressure to all components P mounted in region N at once while heating board S, and to perform a next mounting process of mounting components P in a next region (N+1) while performing the pressing process. In this manner, by performing the pressing process and the mounting process in parallel, waiting time for each process in the cycle of the mounting process and the pressing process is reduced, such that overall work time is reduced.

Also, with component mounter 10 of this embodiment, heater 26 is provided on board holding plate 24, and the entire surface of board S is heated via board holding plate 24 while the entire surface of board S is held by board holding plate 24. By this, it is possible to reduce temperature differences across the entire board, thus curtailing bending and warping of board S caused by temperature differences.

Also, with component mounter 10 of this embodiment, the pressing surface of pressing head 64 is formed to cover the entire width in the Y-axis direction (direction perpendicular to the board conveyance direction) of the mounting region of board S, and the mounting process and the pressing process are performed in parallel while consecutively moving (conveying) boards S. This improves operating efficiency.

Meanwhile, it goes without saying that the disclosure is not limited to the above-mentioned embodiment and various embodiments may be applied within the technical scope of the disclosure.

For example, in an embodiment above, when performing the pressing process and the mounting process in parallel, after completing the mounting process with respect to region (N+1), pressing head 64 is raised after waiting for the completion of the pressing process with respect to region N, but in a case in which the pressing process with respect to region N is completed before the mounting process with respect to region (N+1) is complete, the pressing head may be raised when the pressing process with respect to region N is complete, without waiting for the mounting process to be completed.

Also, with an embodiment above, mounting (mounting process) and pressing (pressing process) of components P is performed by one row each in the Y-axis direction (direction perpendicular to the board conveyance direction), but the mounting process and the pressing process may be performed for two or more rows each. In this case, the width of the mounting target region and the size of pressing head 64 (pressing surface) may be decided based on the size of component P and the quantity of rows to be processed in one cycle (one mounting process and one pressing process).

Also, in an embodiment above, pressing head 64 is configured to be able to press the entire width in the Y-axis direction (direction perpendicular to the board conveyance direction) of the mounting region of board S in one go, but the size of the area that can be pressed in one go may be a narrower region than the entire width in the Y-axis direction. In this case, pressing head 64 may be movable in the Y-axis direction, and the mounting target region may be divided into multiple regions in the Y-axis direction of board S. Further, after performing mounting processing with respect to one mounting target region out of the multiple regions and completing the mounting process, the pressing process may be performed with respect to the target mounting region, and while the pressing process is being performed, the mounting process may be performed on a mounting target region that is a region shifted one in the Y-axis direction, with such a cycle being repeated.

Also, in an embodiment above, pressing head 64 is unable to move in the X-axis direction (board conveyance direction), and components P mounted on board S are pressed by the pressing region being shifted in order by conveying board S a specified distance in the X-axis direction each time; however, pressing head 64 may be movable in the X-axis direction, and components P mounted on board S may be pressed by the pressing region being shifted in order by pressing head 64 being moved with respect to board S a specified distance in the X-axis direction each time.

INDUSTRIAL APPLICABILITY

The present disclosure may be applied to the industrial field of component mounters and the like.

REFERENCE SIGNS LIST

1: component mounting system; 10: component mounter; 12: base; 20: board conveyance device; 22: stand; 24: board holding plate; 24a: suction hole; 26: heater; 28: moving mechanism; 29: suction pump; 30: component supply device; 32: stand; 34: wafer; 38: component camera; 40: XY robot; 41: X-axis guide rail; 42: X-axis slider; 43: Y-axis guide rail; 44: Y-axis slider; 46: X-axis actuator; 48: Y-axis actuator; 50: mounting head; 51: suction nozzle; 52: R-axis actuator; 54: θ-axis actuator; 56: Z-axis actuator; 58: mark camera; 60: pressing device; 62: holding stand; 62a: horizontal section; 64: pressing head; 66: Z-axis actuator; 70: control device; 71: CPU; 72: ROM; 73: HDD; 74: RAM; 75: input-output interface; 76: bus; 80: management device; 81: CPU; 82: ROM; 83: HDD; 84: RAM; 85: input-output interface; 86: bus; 87: input device; 88: display; S: board; P: component

The invention claimed is:

1. A component mounter for mounting components on a board, the component mounter comprising:
    a holding member configured to hold the board at a holding surface;
    a heater configured to heat an entire surface of the board;
    a mounting head configured to mount the components on the board held by the holding member;

a pressing head configured to apply pressure to the component mounted on the board at a specified region that is narrower than a mounting region of the board; and a control means configured to, after using the mounting head to perform a mounting process of mounting a component in the specified region within the mounting region of the board held by the holding member, use the pressing head to perform a pressing process of applying pressure to the component in the specified region mounted on the board while the heater heats the entire surface of the board, and use the mounting head to perform a next mounting process of mounting a component in the next specified region of the board while the pressing process is being performed.

2. The component mounter according to claim 1, wherein the heater is provided on the holding member so as to be capable of heating the entire surface of the board via the holding surface.

3. The component mounter according to claim 2, further comprising:

a feeding mechanism configured to feed the holding member in a specified direction, wherein the control means is configured to, after performing the mounting process, perform the pressing process after heating the board with the heater and feeding the holding member a specified amount using the feeding mechanism in a state with the holding member holding the board, and perform the next mounting process while performing the pressing process, such that the pressing process and the mounting process are performed repeatedly while shifting the specified region by the specified amount each time.

4. The component mounter according to claim 3, wherein the pressing head is configured to apply pressure to the component at, as the specified region, a perpendicular region that is along a perpendicular direction that is perpendicular with respect to the feeding direction of the board, and the control means is configured to, after performing the mounting process of mounting the component in the perpendicular region of the board using the mounting head, perform the pressing process after feeding the holding member the specified amount using the feeding mechanism, and use the mounting head to perform the next mounting process of mounting a component in the next perpendicular region while performing the pressing process.

* * * * *